(12) United States Patent
Schuster

(10) Patent No.: US 6,856,379 B2
(45) Date of Patent: Feb. 15, 2005

(54) POLARIZER AND MICROLITHOGRAPHY PROJECTION SYSTEM WITH A POLARIZER

(75) Inventor: Karl-Heinz Schuster, Koenigsbronn (DE)

(73) Assignee: Carl Zeiss SMT AG, Oberkochen (DE)

(*) Notice: Subject to any disclaimer, the term of this patent is extended or adjusted under 35 U.S.C. 154(b) by 0 days.

(21) Appl. No.: 10/151,867

(22) Filed: May 22, 2002

(65) Prior Publication Data

US 2002/0176166 A1 Nov. 28, 2002

(30) Foreign Application Priority Data

May 22, 2001 (DE) .......................................... 101 24 803

(51) Int. Cl.⁷ .......................... G03B 27/72; G02B 27/28
(52) U.S. Cl. .......................... 355/71; 359/499; 359/500
(58) Field of Search .......................... 355/71, 67, 53, 355/77; 359/497, 498, 499, 500, 238; 428/212

(56) References Cited

U.S. PATENT DOCUMENTS

| | | | |
|---|---|---|---|
| 3,146,294 A | | 8/1964 | Koester et al. |
| 4,755,027 A | | 7/1988 | Schafer |
| 5,001,716 A | | 3/1991 | Johnson et al. |
| 5,365,371 A | | 11/1994 | Kamon |
| 5,436,761 A | | 7/1995 | Kamon |
| 5,638,200 A | | 6/1997 | Xu |
| 5,673,103 A | | 9/1997 | Inoue et al. |
| 5,677,755 A | * | 10/1997 | Oshida et al. .................. 355/53 |
| 5,691,802 A | | 11/1997 | Takahashi |
| 5,847,872 A | | 12/1998 | Ito |
| 6,072,629 A | * | 6/2000 | Fan et al. ..................... 359/497 |
| 6,191,880 B1 | * | 2/2001 | Schuster ....................... 359/238 |
| 6,252,712 B1 | | 6/2001 | Furter et al. |

FOREIGN PATENT DOCUMENTS

| | | |
|---|---|---|
| DE | 30 35 025 A1 | 4/1981 |
| DE | 195 35 392 A1 | 3/1997 |
| DE | 198 07 120 A1 | 8/1999 |
| EP | 0 764 858 A2 | 3/1997 |
| GB | 2 088 078 A | 6/1982 |
| JP | 05181088 A | 7/1993 |
| WO | WO 98/52077 A1 | 1/1998 |

OTHER PUBLICATIONS

M. Born et al, "Principles of Optics", Pergamon Press, p. 694, 1980.

* cited by examiner

Primary Examiner—Peter B. Kim
(74) Attorney, Agent, or Firm—Sughrue Mion, PLLC

(57) ABSTRACT

A polarizer suitable for transforming incident linearly polarized or circularly polarized light into exiting radially or tangentially polarized light with virtually no transmission losses has, in one of its embodiments, a plate fabricated from birefringent material on whose entrance and exit faces small zones (11, 12) with deflecting structures (8, 9) in the form of gratings or Fresnel surfaces have been created. The crystal axis (5) of said birefringent material is aligned parallel to the incident light beam. Said deflecting structures deflect light along a transmission direction (13) that is inclined with respect to said crystal axis (5), causing a phase shift between the field components of the transmitted light. Suitable choices of the angle of inclination (NW) of said transmission direction with respect to said crystal axis and the thickness (D) of said plate will allow transforming incident linearly polarized or circularly polarized light into an exiting light beam with an axisymmetric (tangential or radial) polarization distribution.

63 Claims, 4 Drawing Sheets

POLARIZER AND MICROLITHOGRAPHY PROJECTION SYSTEM WITH A POLARIZER

The following disclosure is based on German Patent Application No. 101 24 803.2 filed on May 22, 2001, which is incorporated into this application by reference.

BACKGROUND OF THE INVENTION

1. Field of the Invention

The invention relates to a polarizer for transforming a light beam incident along an optical axis into an exiting light beam that has a prescribed distribution of locally varying polarization states over its cross-section.

2. Description of Related Art

In the case of microlithographic projection illumination systems, the polarization state of the light employed for imaging is frequently selectively controlled in order to provide higher imaging fidelity. Polarizers similar to those described here located in the illumination system and/or the projection lens may be employed for this purpose.

A polarizer of said type that is intended for use on an illumination system and generates an exiting light beam that is polarized largely in the radial direction over its entire cross-section is known from German Pat. No. DE 195 35 392. Radial polarization is well-suited for use with lenses having typical numerical apertures ranging from about 0.5 to about 0.7 on their image sides and photoresists that have no antireflection coatings, where it is used in order to suppress disturbances due to polarization-sensitive reflections at said photoresists that occur at angles of incidence close to the Brewster angle, which yields optimal coupling of light into the photoresist.

One embodiment of a polarizer for transforming incident linearly polarized light into radially polarized light consists of numerous, hexagonal, half-wave plates covering its entire surface, where said half-wave plates are fabricated from a birefringent material whose crystal axis is aligned with respect to the direction of the incident light beam such that each half-wave plate deflects the direction of polarization of incident light along a radius vector that is aligned on said optical axis and intersects said half-wave plate. This segmented arrangement generates the desired, prescribed distribution of locally varying, preferred, polarization states exclusively by rotating the polarization state of incident light, rather than by filtering, which allows attaining high transmittances. Fabricating polarizers of said type is difficult due to their segmented construction. Furthermore, the polarizer, whose thickness is determined by the wavelength employed and the difference in refractive indices orthogonal to the crystal axis for mutually orthogonally polarized field components, may be very thin, depending upon the wavelength involved and the material employed, which will make mounting elements of said type more difficult.

A projection illumination system for use in microlithography that also introduces radially plane-polarized light in order to prevent distorted imaging on the photoresist is known from U.S. Pat. No. 5,365,371 and the associated CIP-Patent, U.S. Pat. No. 5,436,761, which illustrate several embodiments of polarization filters that lead to high transmission losses. Radial polarizers are installed in the vicinity of the plane of the projection lens' pupil or system stop.

A catadioptric projection lens that may be configured such that it has a segmented polarizing plate situated in the plane of its pupil is known from U.S. Pat. No. 5,691,802. Said segmented plate has a circular inner zone and an annular outer zone that generate mutually orthogonal, linearly polarized light and have differing refractive indices, thereby generating a pair of noninterfering light beams that create mutually distinct image planes, which collectively serves to increase the lens' depth of field.

Polarizing axicon arrangements that, when used in combination with conical surfaces, may be used for generating exiting light beams that are preferentially either radially or tangentially polarized with respect to their optical axis, i.e., have an axi-symmetric distribution of varying, preferred, polarization directions, at every point on their cross-sections, are known from U.S. Pat. No. 4,755,027.

SUMMARY OF THE INVENTION

It is one object of the invention to provide a polarizer of the type stated in the opening paragraph hereof characterized by its simple design, low manufacturing costs, and high transmittance. It is another object to provide a polarizer that is particularly suitable for transforming incident linearly or circularly polarized light into exiting light with an axisymmetric distribution of preferred polarization directions.

As a solution to those and other objects, the invention, according to one formulation, provides a polarizer for transforming a light beam incident along an optical axis into an exiting light beam that has a prescribed distribution of locally varying polarization states over its cross-section, the polarizer comprising the following characteristics:

at least one birefringent element having a crystal axis and a finite axial thickness for generating a phase shift between mutually orthogonally polarized field components of transmitted light;

the illuminated cross-section of said polarizer is subdivided into numerous zones;

at least one of said zones is configured such that its transmission direction for light is inclined with respect to said crystal axis of said zone within said zone at an inclination angle greater than 0° and less than 90° and lies in a transmission plane defined by said transmission direction and said crystal axis;

wherein the axial thickness of said zone and the inclination angle are adapted such that a difference in the optical path lengths of said field components within said zone corresponds to a prescribed relative retardation upon exiting said polarizer and the orientation of the transmission plane of every such zone is prealigned such that the desired, local, preferred polarization directions exist within that zone.

Beneficial embodiments thereon are stated in the dependent claims. The wording appearing in all of said claims is herewith made a part of the contents of this description.

In the case of polarizers in the sense of the invention, at least one birefringent element that has a crystal axis and a finite axial thickness is provided for creating a phase shift between the mutually orthogonally polarized field components of light exiting said polarizers. The illuminated cross-sections of said polarizers are subdivided into numerous zones or fields that are preferably arranged such that they cover its entire cross-section. At least one of said zones is configured such that the direction in which it transmits light is inclined with respect to that zone's crystal axis. Preferably, each such zone should be configured in this manner. Transmission at an angle with respect to the crystal axis is characterized by the transmission direction being inclined at an angle of inclination greater than 0° and less than 90° with respect to the direction of said crystal axis.

Said transmission direction and said crystal axis define a plane of transmission. The axial thickness and angle of inclination of each of said off-axis-transmitting zones are chosen in relation to one another such that the optical-path difference for said field components corresponds to a prescribed retardation after transiting said polarizer, where said retardation is preferably identical over its entire cross-section. The orientations of said transmission plane and said direction of inclination for each such off-axis-transmitting zone are chosen such that the desired, preferred, local polarization direction is obtained at its exit face.

Said polarizer thus acts as a retardation plate at each of its zones through which light is transmitted off-axis and for which the retardation, $G=W \times |n_{ao}-n_o|$, equals the product of the path length traversed, $W$, transited along the transmission direction between its entrance face and its exit face and the difference, $n_{ao}-n_o$, in its refractive index, $n_{ao}$, for the extraordinary ray and its refractive index, $n_{ao}$, for the ordinary ray for the pair of mutually orthogonally polarized field components (the extraordinary ray and the ordinary ray), where the difference in said refractive indices for said field components, which partly determines said retardation, will depend upon the angle of inclination, NW, and the type of birefringent material involved and may be established by suitably setting said angle of inclination.

If, for example, a small angle of inclination with respect to said crystal axis is set, then the difference in refractive indices, which will be zero along said crystal axis, will be relatively low, which means that the axial thickness will have to be chosen correspondingly large in order to yield a given retardation. Same will simplify the fabrication and handling of polarizers according to the invention, which may be fabricated in the form of loose components, if desired. The choice of axial thickness may be utilized to adapt the operation of the polarizer to the polarization state of light incident on same and the desired polarization distribution for light exiting same. If, for example, a retardation of one-quarter of the wavelength of said light has been set, then circularly polarized light incident on said polarizer may be transformed into linearly polarized light exiting its exit face by each of said zones. Altering the direction of said inclination will allow orienting the preferred polarization direction over the exit plane for each such zone, for example orienting same either tangentially or radially with respect to the polarizer's optical axis. Setting a half-wave retardation will allow locally rotating the plane of polarization of transmitted linearly polarized light relative to that of incident linearly polarized light, where the plane of polarization of said transmitted linearly polarized light may, in turn, be oriented with respect to the optical axis, preferably either tangentially or radially oriented with respect to same, through suitable choices of the local directions of inclination within said zones.

A beneficial advance thereon is distinguished by the fact that it has a birefringent element with its crystal axis oriented roughly parallel to the polarizer's optical axis and that a deflecting structure that deflects incident light such that it transits each of said zones at the inclination angle and direction chosen for that zone is assigned to each of said zones of said birefringent element, which will allow configuring a simply designed, particularly readily fabricated, unsegmented polarizer using a single birefringent element covering the entire cross-section of said polarizer.

Said birefringent element should preferably have deflecting structures for deflecting incident light to the off-axis transmission direction arranged on its entrance face and deflecting structures arranged on its exit face that cancel said deflections in order to allow light to exit parallel to the direction of incidence. For example, said birefringent element might be formed from a plane-parallel plate fabricated from magnesium fluoride or crystalline quartz, where said deflecting structures are created by providing suitably structured zones on its entrance and/or exit surfaces, which will allow using a polarizer, essentially in the form of a thin plate, consisting of a single optically active element that thus may be incorporated into a projection illumination system at a suitable location therein, even if the space available therefore is limited.

Said deflecting structures on each of said zones serve to deflect light incident on each of said zones to the transmission direction chosen for that zone or to cancel said deflections, where said deflecting structures may be either diffracting structures similar in type to, e.g., line gratings, in order to create refractive structures similar in type to, e.g., Fresnel surfaces, or, for example, structures similar in type to a blazed grating, for which both optical diffraction and refraction contribute to said deflections. Holographic structures are also possible.

It will be useful if the illuminated cross-section of said polarizer is subdivided into small fields or zones, e.g., small hexagonal zones, of constant deflection that more or less cover the entire illuminated cross-section of said polarizer. Other, preferably polygonal-shaped, zones, e.g., square or triangular zones, are possible. The total number of said fields or zones should preferably range from 10 to 100 or more in order that said zones will typically have cross-sectional areas occupying an average of less than 10%, preferably 1% to 10%, of the total cross-sectional area of said polarizer, where the dimensions of said zones may be adjusted to suit the directional tolerances on the desired, local, preferred, polarization direction, which, in the case of the preferred embodiment of said polarizer, will be roughly ±2% or less. Employing smaller-sized zones will allow attaining a nearly continuous distribution of the desired, local, tangential or radial polarizations. Structures having continuous transitions from zone to zone and no well-defined zonal boundaries represent another possibility. It will also be possible to leave narrow vacant spaces between said active zones, which will be tolerable, particularly when said polarizer is employed on illumination systems.

Polarizers of the type described are particularly inexpensive to fabricate. Raw silicon-dioxide or magnesium-fluoride crystals with the required orientation of their crystal axis, even such with diameters as large as, for example, 20 cm or 30 cm, for fabricating their birefringent plate are available, particularly silicon-dioxide crystals. Only a single such plate, which, due to its thickness of, typically, a few tenths of a millimeter, is relatively rugged and easy to handle during fabrication, need be fabricated in order to make a polarizer. Said deflecting, i.e., diffractive and/or refractive, structures on the surface of said plate may be fabricated using suitable lithographic processes in order to keep fabrication costs low when large numbers of such plates are fabricated. Said structures may also, in principle, be created by mechanical means.

Another class of polarizers according to the invention is characterized by several birefringent elements arranged over its cross-section, preferably covering its entire surface, where the crystal axis of each of said birefringent elements is tilted with respect to the polarizer's optical axis in the skewed manner described at the outset hereof such that the desired angle and direction of inclination are obtained for the particular zone involved. Involved here are thus segmented polarizers that are constructed similarly to those embodiments shown in FIG. 1 of German Pat. No. DE 195 35 392, except that, in the case of polarizers according to the invention, the crystal axes of individual zones are inclined with respect to said optical axis and to the plane of said plate.

The invention also relates to a microlithographic projection system incorporating at least one polarizer according to same. Said projection system has an illumination device equipped with a light source, for example, a laser, for illuminating a mask, where said illumination device is followed by a projection lens for imaging a pattern borne on said mask onto the image plane of said projection lens, where the item to be structured, for example, a wafer coated with a layer of photoresist, is situated. Incorporating one or more polarizers according to the invention will allow fully utilizing the capabilities of the optics involved. For example, using a polarizer to radially polarize the transmitted beam will improve the efficiency and homogeneity with which light is coupled into said layer of photoresist, since reflections by said photoresist and all those lenses that follow said polarizer in the optical train will be uniformly reduced. For light incident at large angles less than the Brewster angle, said effect will be most pronounced wherever the light intensity is lowest due to the decline in light intensity that occurs near the edges of the illuminated area. Any adverse effects on spatial resolution due to scattered light, included light scattered at the interface between said photoresist and said wafer, will be homogenized and reduced.

On the other hand, tangential polarization may be beneficial in cases where anti-reflection-coated photoresists and very high image-side numerical apertures are employed, in which case, interference-fringe contrast will be the determining factor. Interference-fringe contrast will be maximized when dual-beam interference of a pair of beams whose polarizations are oriented orthogonal with respect to the plane of incidence occurs. It has been found that tangential polarization allows markedly increasing interference-fringe contrast.

Polarizers according to the invention are preferably arranged within illumination systems, i.e., between said light source and said mask illuminated by said light source. Arranging said polarizers near the origin of the beam path will be particularly beneficial in the case of radially polarizing polarizers in order that the benefits of radial polarization may be utilized for coupling light into the lenses that follow said polarizers in the optical train. However, asymmetrical optical elements, for example, deflecting mirrors, such as those employed for shortening the lengths of illumination systems or those employed on catadioptric projection lenses, that will usually alter the polarization state of incident light, should also be taken into account. It will be beneficial to arrange said polarizer following, in the direction in which light is transmitted, the final, polarizing component that is not symmetrical with respect to the illumination system's optical axis, which, in the case of systems having projection lenses consisting exclusively of refractive optical elements, could be the final deflecting mirror of said illumination system, or, in the case of catadioptric projection lenses, the final mirror of said projection lenses, in order to provide for the best possible, undisturbed transmission of the polarization distribution prevailing at the exit of said polarizer all the way through to said projection lens' image plane.

To be particularly preferred is an arrangement where said polarizer is incorporated into said illumination system and situated in a plane that is conjugate to the plane of said projection lens' stop, where it may influence the polarization distribution in the vicinity of the system stop of said projection lens without need for incorporating a polarizer in said vicinity, which will be beneficial, since said polarizer may then readily meet the phase and beam-deflection requirements of the illumination system, which would be much more difficult if it were incorporated into said projection lens. Accurately duplicating the polarization distribution prevailing at the exit of said polarizer will, however, as mentioned above, only be possible if none of the components that follow said polarizer in the optical train have any major effects on polarization or if their effects cancel one another.

Said favorable arrangement of polarizers at uncritical locations within an illumination system will allow making them interchangeable in order that they may be replaced by other types of polarizers, e.g., polarizers that will yield circular polarization, radial polarization, or tangential polarization in the plane of said wafer, as demanded by the particular application involved.

The previous and other properties can be seen not only in the claims but also in the description and the drawings, wherein the individual characteristics may be used either alone or in sub-combinations as an embodiment of the invention and in other areas and may individually represent advantageous and patentable embodiments. It is shown in:

DETAILED DESCRIPTION OF THE PREFERRED EMBODIMENTS

Figure 1:
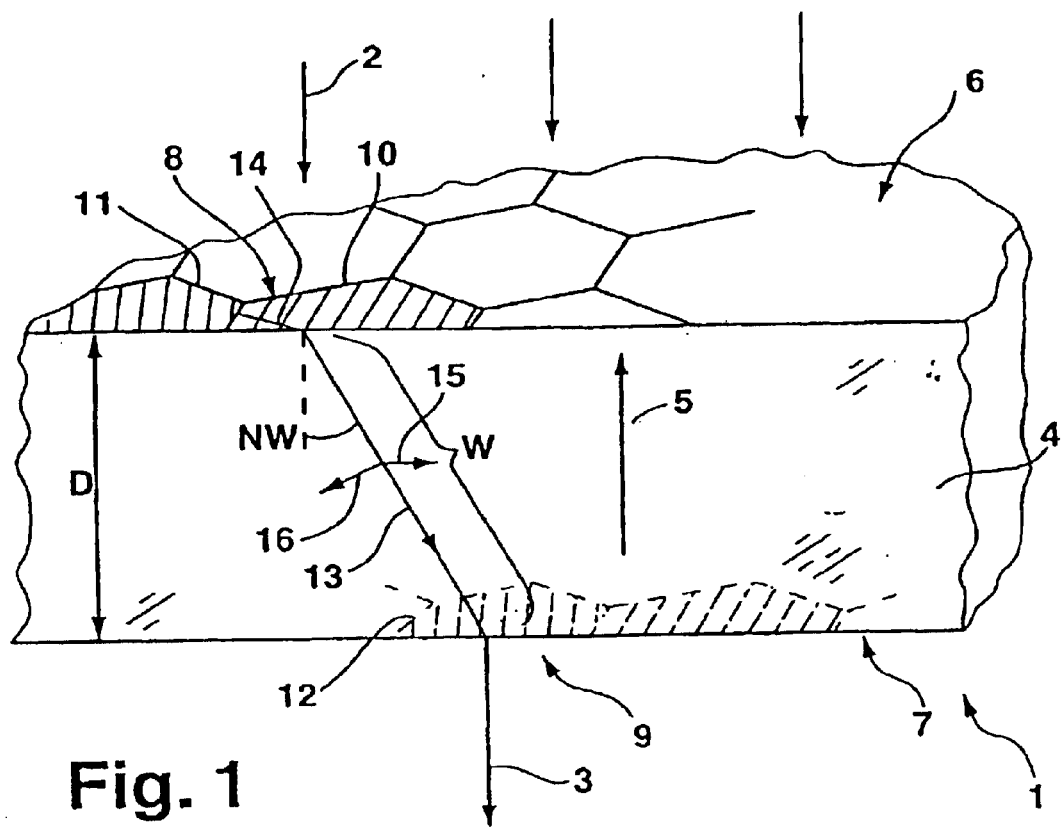
FIG. 1 is a schematized section through a preferred embodiment of a polarizer according to the invention that has deflecting structures, on the entrance and exit faces.

FIG. 1 depicts a preferred embodiment of a polarizer 1 according to the invention for transforming incident circularly polarized light 2 into radially polarized light 3 at its exit. The heart of said radial polarizer is a plane-parallel plate 4 fabricated from an anisotropic, optically uniaxial crystal whose crystal axis 5 is roughly parallel to its plane-parallel outer surfaces 6, 7. The material from which said plate is fabricated is transparent to light at the operating wavelength, where the preferred operating wavelengths lie in the UV spectral region and are less than about 260 nm. Said monolithic plate 4 may be fabricated from, e.g., magnesium fluoride for use at a wavelength of 157 nm or from magnesium fluoride or quartz (silicon dioxide) for use at a wavelength of 193 nm. Said plate 4 is inserted into the path of the beam to be affected such that its crystal axis 5 is roughly perpendicular to its plane-parallel outer surfaces 6, 7. The axial thickness D of said plate will typically be roughly several tenths of a millimeter and may, if necessary, be large enough, e.g., roughly 0.5 mm–3 mm, that it will be self-supporting when installed. A support fabricated from an isotropic material, e.g., quartz glass or calcium fluoride, on which said plate will be held in the operating position by its own weight may also be provided for supporting said plate.

Deflecting structures 8, 9 with mutually correlated deflection characteristics are formed on the entrance face 6 and exit face 7 of said plate. In the case of the example shown, said deflecting structures are in the form of hexagonal zones that cover the full extents of said plate's entrance face 6 and exit face 7. Within each such hexagonal zone there is a deflecting structure that acts in similar fashion to a ruled diffraction grating, where the orientation of the latter's parallel ruled lines differ from zone to zone, usually by several degrees of arc.

The operation of said polarizer will now be explained, based on the actions of said mutually correlated diffractive structures 10 (on the upper face 6 of said plate) and 12 (on the lower face 7 of said plate). Light 2 incident parallel to the optical axis of said system strikes said deflecting structure 10 on said entrance face 6 of said plate. This transmission grating deflects incident radiation by means of diffraction such that the direction 13 in which the first diffracted order of said radiation is transmitted through said plate 4 will be skewed with respect to the latter's crystal axis 5. To be interpreted as "skewed" or "inclined" here is any transmission direction that is neither parallel nor orthogonal to said crystal axis 5. Such transmission directions are characterized by inclination angles NW ranging from more than 0° to less than 90°. Said diffractive structure 12 on said exit face 7 of said plate cancels the deflection produced by said structure 10 on the entrance face 6 of said plate, since it has the same grating constant as the latter structure 10, which means that that light 3 exiting said plate will be displaced parallel to the optical axis of said system and offset with respect to said incident light. The relationships involved have been grossly exaggerated in FIG. 1. The direction of said crystal axis 5 and the transmission direction 13 define a plane of transmission whose line of intersection 14 with said entrance face 6 of said plate is orthogonal to the lines of said deflecting grating structure 10, defining the direction of inclination. The dependence of the path length W traversed by light within said crystal along the transmission direction 13 on the thickness D of said plate and said inclination angle NW is given by $W=D/\cos(NW)$.

Figure 2:
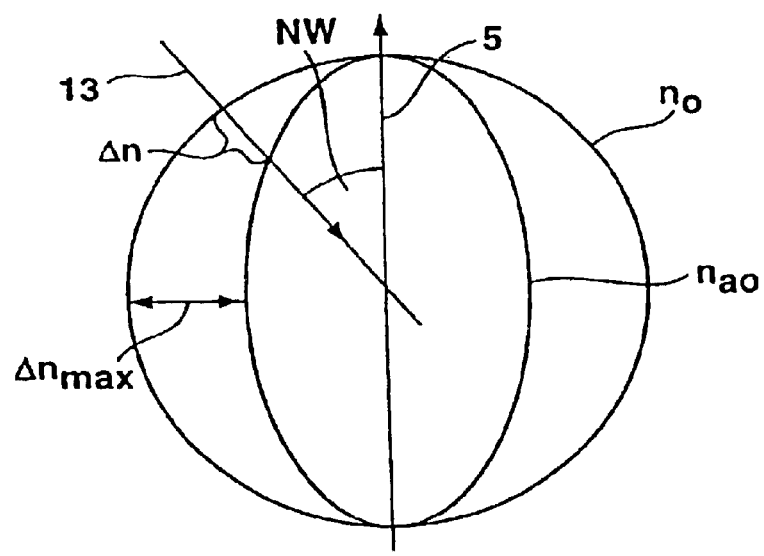
FIG. 2 is a diagram used for explaining the operation of the polarizer shown in FIG. 1.

Due to the birefringence of the material from which said plate 4 had been fabricated, a light wave with two mutually orthogonal directions of oscillation, i.e., a light wave in the form of mutually orthogonally polarized field components, will propagate within said plate, where the direction of oscillation 15 of one of said components will lie in said plane of transmission and the direction of oscillation 16 of the other of said components will be orthogonal to said plane of transmission. For the purpose of the present patent application, said component 15 oscillating in said plane of transmission will be termed the "ordinary ray" (subscript o) and said component 16 oscillating orthogonal thereto will termed the "extraordinary ray" (subscript ao). Different indices of refraction, no for the ordinary ray and $n_{ao}$ for the extraordinary ray, that, in general, will vary with the transmission direction involved will apply to each of said components in the case of birefringent materials. Their interrelationship is schematically illustrated in FIG. 2 for the case of a negative uniaxial birefringent crystal. As is generally known, the refractive index, no, for the ordinary ray is the same in all directions, while the refractive index, $n_{ao}$, for the extraordinary ray will vary with said inclination angle NW with respect to said crystal axis 5. Although their difference, $\Delta n=|n_{ao}-n_o|$, will vanish, i.e., $n_o$ will be equal to $n_{ao}$, along said crystal axis 5, it will reach a maximum, $\Delta n_{max}$, for directions orthogonal thereto. As is known from the theory of retardation plates, said mutually orthogonally polarized field components will exit said birefringent material traveling in the same direction but with a retardation, G, given by $G=W\times|n_{ao}-n_o|$.

A special feature of said polarizer is that said inclination angle NW may be set to a value falling within a range bounded by certain limiting values by suitably dimensioning and/or configuring said deflecting structures, where said inclination angle in the case of the ruled-grating structure shown, will increase as its grating constant (the distance between adjacent lines, measured orthogonal to said lines) decreases. As may be seen from FIG. 2, said difference, $\Delta n$, in the refractive indices for the ordinary ray and the extraordinary ray, may take on very low values that will be no more than a small fraction of their maximum difference, $\Delta n_{max}$, which would be reached if the angle between said direction of light propagation 13 and said crystal axis 5 were a right angle, in the vicinity of small inclination angles, i.e., when said transmission direction 13 is nearly coincident with said crystal axis 5. The opportunity for setting very low differences in the indices of refraction for said ordinary ray and said extraordinary ray for a plate fabricated from a given material created by the invention ray, in the case of polarizers according to the invention, lead to the thickness D of said plate required to yield a desired retardation, G, of said polarization components at the exit of said polarizers being many times greater than that for conventional retardation plates for which the direction of propagation of the light incident on same is orthogonal to their crystal axis. The invention will thus allow avoiding inconveniently thin polarizers, which will be beneficial, particularly in cases where polarizers with large cross-sections are preferably employed.

In the case of the embodiment shown in FIG. 1, said thickness D of said plate and said inclination angle NW, which has been set by choosing suitable grating constants for said deflecting gratings, have been chosen to yield a retardation, G, between said field components 15, 16 of said transmitted light of one-quarter of the wavelength of said incident light over said path W, which will, analogous to the case of a quarter-wave plate, transform incident circularly polarized light into linearly polarized light exiting at its exit face. In the case of another embodiment, said inclination angle NW and said thickness D of said plate have been attuned to one another such that, analogous to the case of a half-wave plate, the retardation between said polarization components will be one-half wave. Polarizers of said type are suitable for rotating the plane of polarization of incident linearly polarized light.

The orientation of said preferred direction of polarization for each of said zones upon exiting said polarization plate may be varied by orienting said deflecting structures on each of said zones. The orientations of the latter will determine the orientation of the plane of transmission for each such zone, i.e., will determine same locally, and thus will also determine the orientations of the planes of oscillation of said mutually orthogonally polarized field components 15, 16. Said orientations of same 15, 16 are also termed "induced crystal axes."

Said inclined or skewed deflection of polarizers according to the invention may be utilized for generating exiting light 3 that will be either tangentially or radially polarized over each such zone, i.e., will be locally either tangentially or radially polarized, from incident light 2. However, said skewed or inclined deflection must, in the case of circularly polarized incident light, be at an angle of 45° in order that said induced crystal axes 15, 16 will also be locally oriented at an angle of 45° with respect to the desired radial, or tangential, orientations on the exit face of said polarizer, which will be explained in greater detail based on FIG. 3, which depicts a top view of the polarizer shown in FIG. 1. The orientations of the lines on the gratings of said deflecting structures, the orientations of the planes of transmission determined by same, which are indicated by the lines of intersection 14 of said planes of transmission with the upper surface 6 of said plate, and the resultant orientations of said induced crystal axes (indicated by the arrows) have all been indicated. The radius vector 23, 24, 25 associated with each such facet, which originates on the optical axis 26 of said polarizer and passes through the center of the facet involved, has also been indicated for several, selected, hexagonal zones 20, 21, 22.

Figure 4:
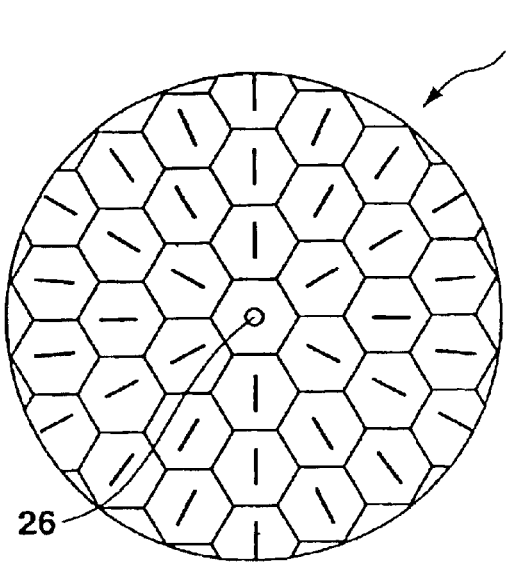
FIG. 4 shows the orientations of the planes of polarization of radially polarized light rays exiting the exit face of the polarizer shown in FIG. 3.

Since said induced crystal axes 15, 16 must be locally oriented at an angle of 45° with respect to the respective radial directions of said zones in order to obtain radially polarized light at the exit of said polarizer, both each of said planes of transmission of said zones and said lines on each of said diffracting structures will be oriented at an angle of 45° with respect to their respective radial directions, which will cause each such quarter-wave facet to transform incident circularly polarized light into linearly polarized light whose polarization direction in the vicinity of the center of said facet will be accurately aligned along the radial direction for that facet as it exits at its exit face (cf. FIG. 4). It may be seen that said diffractive structures responsible for said deflections arc outward from the central optical axis 26 of said polarizer like turbine blades but will have finite lengths, since fields, or zones of finite size with constant deflection will be formed. The maximum acceptable directional tolerances, i.e., the maximum tolerated departures of the local directions of polarization from the desired radial polarization over the entire surface of the exit face of said polarizer, may be set for each particular application to be involved by adjusting the sizes of said zones. Continuous transitions from local orientation to local orientation, with no predetermined zone boundaries, will also be possible.

The principle of the invention, which has been explained based on a sample embodiment of same, may also be immediately applied to polarizers intended for use in other types of applications. For example, a polarizer for transforming incident circularly polarized light into tangentially polarized light at its exit that is based on the structure shown in FIG. 3 may be obtained by rotating the lines on said gratings of said deflecting structures of each of said zones through 90° with respect to the direction of said crystal axis. Light exiting the exit face of each of said zones will then be tangentially polarized, as shown in FIG. 5.

Figure 5:
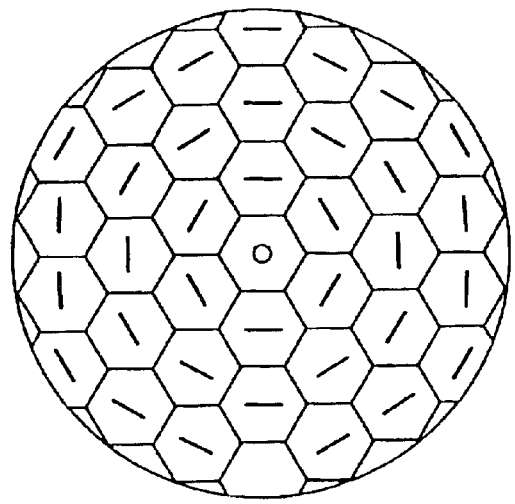
FIG. 5 shows the orientations of the planes of polarization over the exit face of another embodiment of a monolithic polarizer for generating tangentially polarized light.

Said principle may also be utilized for generating linearly polarized light that has a desired polarization direction, for example, the radial polarization shown in FIG. 4 or the tangential polarization shown in FIG. 5, over each such zone from an incident light beam that is linearly polarized in a single direction over its entire cross-section by locally rotating the plane of polarization of linearly polarized light exiting said zones. In order to obtain same, the thickness D of said plate should be attuned to said inclination angle NW such that said difference in the indices of refraction for the ordinary and extraordinary rays, which will depend upon the inclination angle involved, over the path length W traversed by the transmitted light, will yield the desired retardation of one-half wavelength. In addition, for each such zone, said deflecting structures will have to be aligned such that an induced crystal axis will locally be accurately aligned on the bisector of the included angle between the polarization direction of said incident light and the desired polarization direction, e.g., the tangential or radial direction. In the case of half-wave plates, it is well-known that that the polarization direction of the light exiting same is obtained by reflecting the direction of propagation of said incident light at one of said induced crystal axes. In the case of the aforementioned retardations, varying retardations that, in the case of preferred embodiments of said polarizer, will depart from the desired quarter-wave or half-wave retardation by ±5%–±10%, depending upon the thickness of said plate and variations in the angle of incidence of said incident light, may occur.

Figure 6:
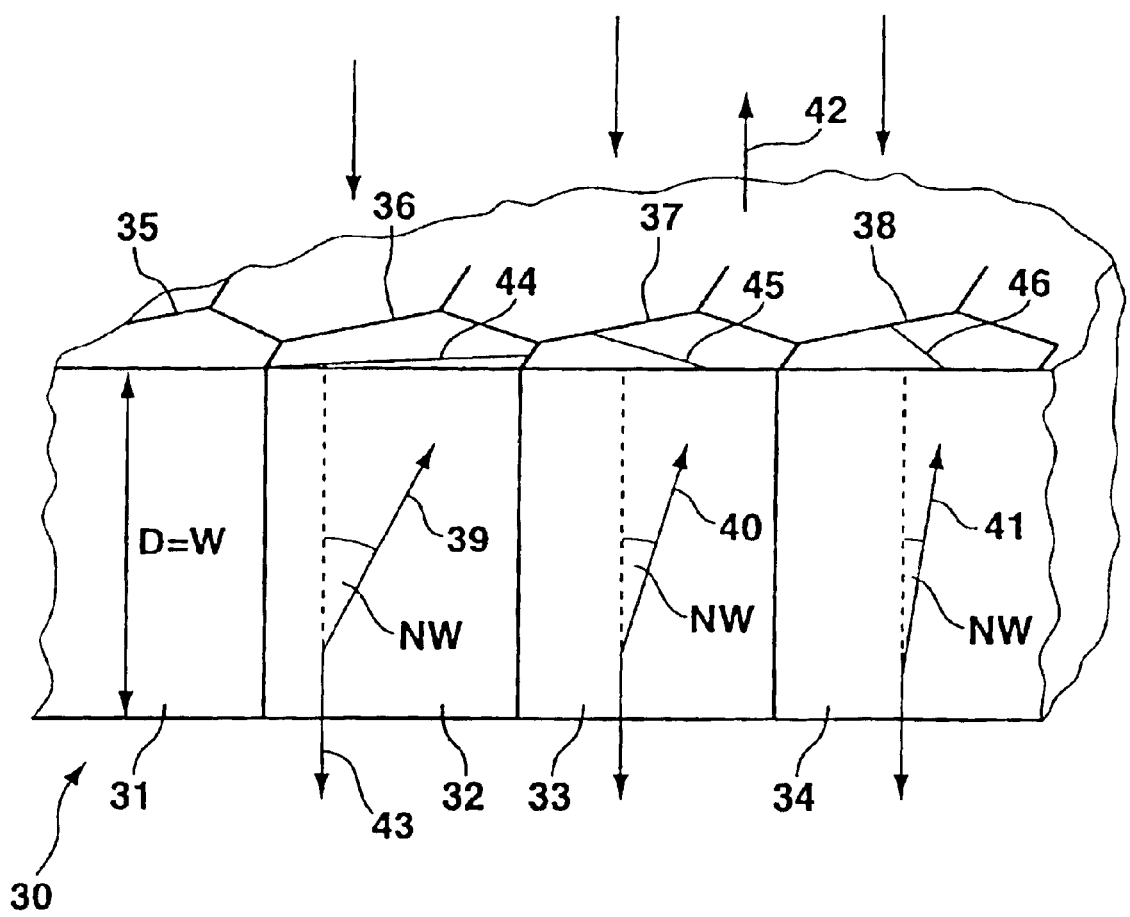
FIG. 6 is a schematic view of an embodiment of a segmented polarizer according to the invention.

FIG. 6 depicts an example of another embodiment of a polarizer according to the invention. However, said polarizer 30, which is also in the form of a plane-parallel plate with an axial thickness D, differs from the embodiment shown in FIG. 1 in that it consists of several birefringent elements 31–34, each of which has a regular, hexagonal shape, attached to one another by, e.g., optically contacting same, that have been assembled into a mosaic, leaving no gaps between said elements, such that same forms a planar polarizer, where the dimensions of said hexagonal zones 35=14 38 may be such that they agree with those of the hexagonal zones shown in FIG. 1. Said optical elements 31–34 have been cut from a block of birefringent material such that their crystal axes 39, 40, 41 are skewed with respect to the lateral surfaces and the upper/lower surfaces of said hexagonal zones, respectively, where the inclination angle NW of the crystal axis of each such element with respect to the optical axis 42 of said polarizer is the same for all of said elements. Nevertheless, over the segment thereof shown, adjacent optical elements will differ from one another in that their crystallographic axes will assume differing angular positions about said optical axis 42 of said polarizer, which means that, with the exception of certain vicinities, said crystallographic axes of said optical elements will be intertwined about said optical axis 42, i.e., will not be parallel to one another. Said intertwining will, in the case of light transmitted along a direction 43 parallel to said optical axis 42, cause the plane of transmission of each of said optical elements, defined by their respective transmission directions 43 and crystal axes, to have a different orientation, as schematically indicated by the lines of intersection 44, 45, 46 of said planes of transmission of three of said optical elements 32, 33, 34.

As in the case of the embodiment described above, said polarizer employs the principle of a retardation plate for its operation. Upon entering said polarizer, incident light will be decomposed into an ordinary ray and an extraordinary ray propagating at different speeds determined by the index of refraction that applies to same, which will lead to a retardation, G, given by $G = W \times |n_{ao} - n_o|$, where the path length W traversed will equal the thickness D of said plate and the difference in the indices of refraction shown in FIG. 2 will be determined by said angle of inclination NW, which, in turn, will be determined when said optical elements are cut from a large block of crystalline material. As in the case of embodiments according to FIG. 1, said thickness D of said plate may be made sufficiently large that same will be easier to handle by choosing a smaller angle of inclination NW and correspondingly differences in indices of refraction.

In the event that circularly polarized light is to be locally transformed into linearly polarized light, said thickness D should be chosen such that the resultant retardation equals one-quarter of the wavelength of said light. If the plane of polarization of linearly polarized light is to be rotated, then said retardation should be set to one-half of said wavelength. The orientations of the planes of polarization of linearly polarized light exiting each of said optical elements will be determined by the orientations of their respective planes of transmission, which be oriented in manners similar to that shown in FIG. 3 in order to yield a radial polarizer, or may be rotated through 90° in order to yield a tangential polarizer. One major benefit of this embodiment is that need for employing deflecting structures that may require some rather complicated fabrication operations, may be eliminated.

Figure 7:
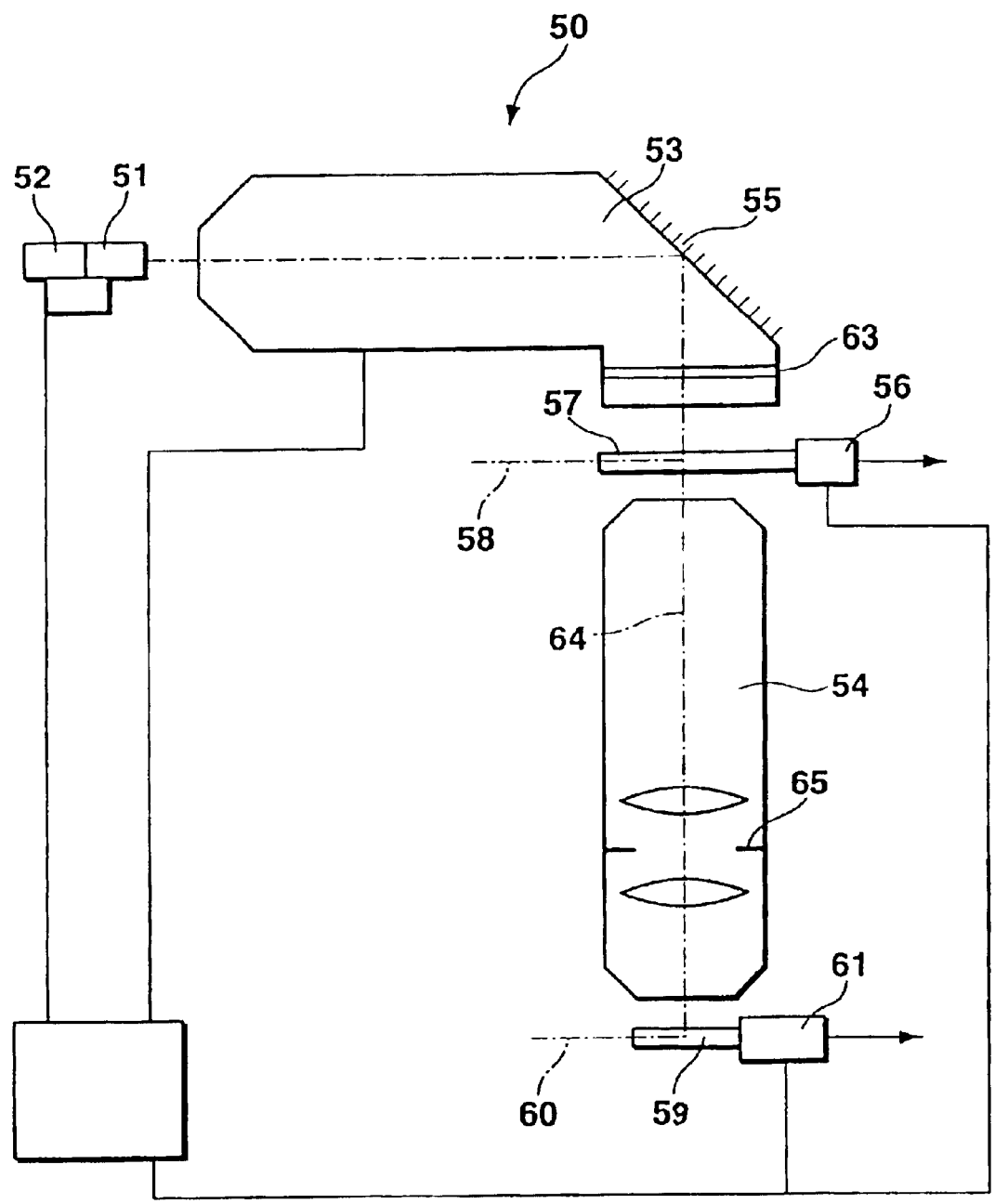
FIG. 7 is a microlithographic projection illumination system with a polarizer according to the invention in its illumination system.

FIG. 7 depicts a microlithographic projection illumination system 50 that is equipped with a polarizer according to the invention. Said system, which, in this particular case, is a wafer scanner, comprises a laser light source 51 with a device 52 for narrowing the bandwidth of its laser, which emits a linearly polarized light beam. An illumination system 53 generates a large, sharply defined, highly homogeneous, illuminated field that has been adapted to suit the telecentricity requirements of the projection lens 54 that follows it in the optical train. Said illumination system 53 has devices for selecting an illumination mode and may, for example, be switched among conventional illumination with a variable degree of coherence, an annular illuminated field, and dipole or quadrupole illumination. Said illumination system includes a deflection mirror 55 in order to reduce the overall length of same. Said illumination system is followed by a device 56 for holding and manipulating a mask 57 that has been arranged such that said mask lies in an image plane 58 of said projection lens 54 and is translatable over said plane using a scanning drive. Said projection lens 54 has been designed to be an axisymmetric reduction lens containing refractive optical elements only that projects a reduced image of said mask onto a wafer 59 coated with a layer of photoresist, where said wafer is arranged in the image plane 60 of said of said projection lens 54 and is held in place by a device 61 that includes a scanning drive in order to allow translating said wafer in synchronism with said mask 57. All of said systems are controlled by a controller unit 62.

Figure 3:
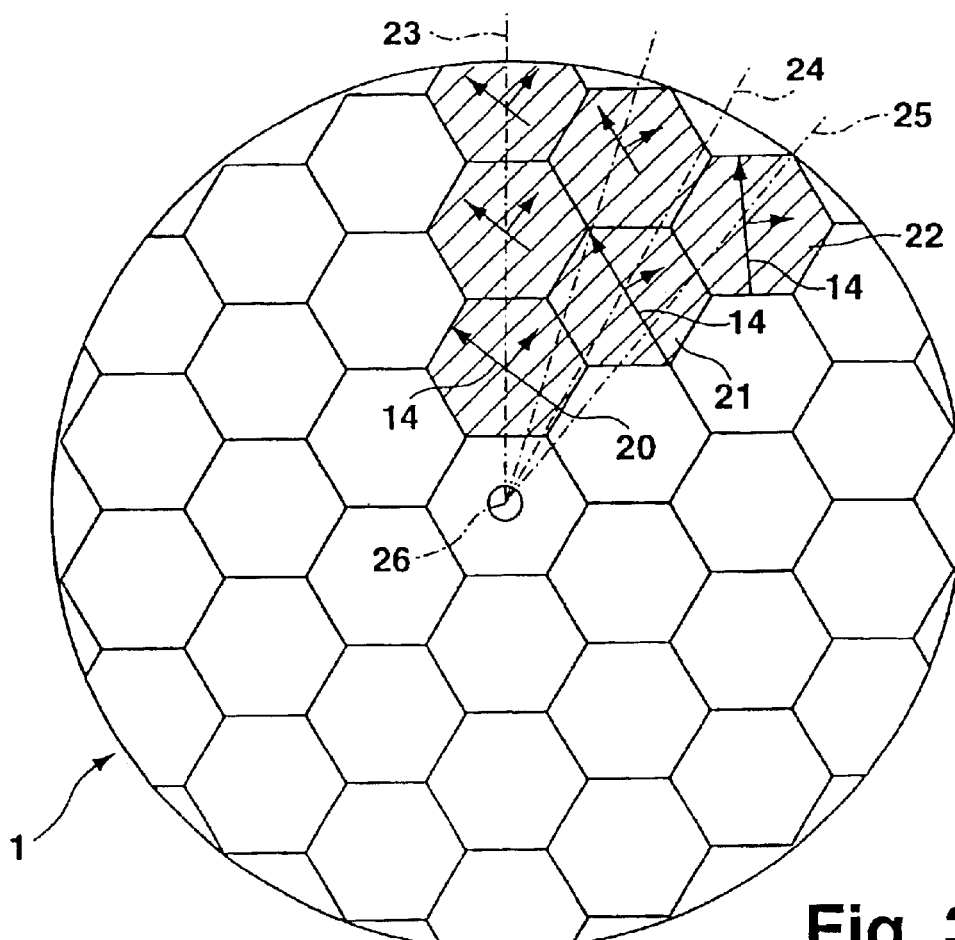
FIG. 3 is a top view of the polarizer shown in FIG. 1, which has a grid of hexagonal deflecting zones for transforming circularly polarized light into radially polarized light.

Within said illumination system 53, said deflecting mirror 55 is followed by a polarizer 63 according to the invention inserted into said system's optical train, where said polarizer may be configured either as a monolithic plate like that of the embodiment shown in FIG. 1 or as a segmented polarizer like that shown in FIG. 6. The axial thickness of said polarizer has been chosen such that it acts in a manner similar to a half-wave plate and transforms incident light that is linearly polarized over its entire cross-section into light that is radially polarized, as shown in FIG. 3, exiting at its exit face. Said radial polarization lies in the plane 58 of said mask and will be carried over to said image plane 60, since there are no elements, such as mirrors or similar, following said polarizer that might affect said polarization. Said radial polarization has a beneficial effect on the transmittances of the coated lenses of said projection lens 54, particularly at high numerical apertures, which will increase the intensities of projected images, thereby increasing wafer throughputs. Said polarizer 63 has been arranged along the optical axis 64 of said system such that it lies in a plane conjugate to the plane of said system's system stop 65, which will allow generating a linear polarization in the vicinity of said system stop that will be a function of the location of said projection lens' pupil, without need for adding any further optical elements to said vicinity, which would be difficult or impossible anyhow in the case of many high-performance lenses, due to the limited space available for same.

The above description of the preferred embodiments has been given by way of example. From the disclosure given, those skilled in the art will not only understand the present invention and its attendant advantages, but will also find apparent various changes and modifications to the structures and methods disclosed. It is sought, therefore, to cover all changes and modifications as fall within the spirit and scope of the invention, as defined by the appended claims, and equivalents thereof.

What is claimed is:

1. A polarizer for transforming a light beam incident along an optical axis into an exiting light beam that has a prescribed distribution of locally varying polarization states over its cross-section, the polarizer comprising:

at least one birefringent element having a crystal axis and a finite axial thickness for generating a phase shift between mutually orthogonally polarized field components of transmitted light;

the illuminated cross-section of said polarizer is subdivided into numerous zones;

at least one of said zones is configured such that its transmission direction for light is inclined with respect to said crystal axis of said zone within said zone at an inclination angle greater than 0° and less than 90° and lies in a transmission plane defined by said transmission direction and said crystal axis;

wherein the axial thickness of said zone and the inclination angle are adapted such that a difference in the optical path lengths of said field components within said zone corresponds to a prescribed relative retardation upon exiting said polarizer and the orientation of the transmission plane of every such zone is prealigned such that the desired, local, preferred polarization directions exist within that zone, whereby the prescribed distribution of locally varying polarization states is obtained exclusively by rotating the polarization state of the incident light beam, rather than by filtering.

2. A polarizer according to claim 1, wherein each of said zones is configured such that its transmission direction for light is inclined with respect to said crystal axis of said zone within said zone at an inclination angle greater than 0° and less than 90° and lies in a transmission plane defined by said transmission direction and said crystal axis; and wherein the axial thickness of each of said zones and the inclination angle are adapted such that a difference in the optical path lengths of said field components within each said zone corresponds to a prescribed relative retardation upon exiting said polarizer.

3. A polarizer according to claim 1, wherein said birefringement element has the crystal axis aligned roughly parallel to an optical axis of the polarizer; and further comprising at least one deflecting structure assigned to said birefringement element, said deflecting structure being designed to yield the prescribed inclination angle and inclination direction for that zone.

4. A polarizer according to claim 3, wherein a separate deflecting structure is assigned to each of said zones.

5. A polarizer according to claim 3, wherein said birefringement element is a single element extending over the entire cross-section of the polarizer.

6. A polarizer according to claim 3, wherein deflecting structures for deflecting incident light along said inclined transmission direction are provided on an entrance face of said birefringent element and deflecting structures for reversing said deflection are provided on an exit face of said birefringent element.

7. A polarizer according to claim 3, wherein said birefringent element is a plate fabricated from a birefringent material, wherein deflecting structures are formed directly on at least one of an entrance face and an exit face of said plate.

8. A polarizer according to claim 3, wherein that birefringement element is fabricated from one of magnesium fluoride and crystalline quartz.

9. A polarizer according to claim 3, wherein at least one of said deflecting structures is a diffractive structure.

10. A polarizer according to claim 3, wherein at least one of said deflecting structures is a refractive structure.

11. A polarizer according to claim 3, wherein at least one of said deflecting structures is a diffractive and refractive structure.

12. A polarizer according to claim 3, wherein at least one of said deflecting structures deflects light in the manner of a hologram.

13. A polarizer according to claim 1, wherein a plurality of birefringent elements is arranged over the cross-section of the polarizer, wherein each such element forms a zone and has a finite axial thickness, and wherein a crystal axis of each such birefringent elements is inclined with respect to said transmission direction for light such that said transmission plane is defined by said crystal axis and said transmission direction.

14. A polarizer according to claim 13, wherein said birefringement elements extend over the entire surface of the polarizer.

15. A polarizer according to claim 1, wherein said polarizer is designed to transform incident circularly polarized light into exiting, locally linearly polarized light.

16. A polarizer according to claim 15, wherein the exiting polarizered light is one of tangentially and radially polarized.

17. A polarizer according to claim 15, wherein said prescribed relative retardation is roughly one-fourth the wavelength of said incident light.

18. A polarizer according to claim 1, wherein said polarizer is designed to transform incident light that is linearly polarized in a single direction over its entire cross-section into exiting, locally linearly polarized light.

19. A polarizer according to claim 18, wherein the exiting polarizered light is one of tangentially and radially polarized.

20. A polarizer according to claim 12, wherein said prescribed relative retardation is roughly one-half the wavelength of said incident light.

21. A polarizer according to claim 1, wherein said polarizer has an axial thickness in excess of 100 $\mu$m.

22. A polarizer according to claim 1, wherein said polarizer has an axial thickness between approximately 200 $\mu$m and approximately 600 $\mu$m.

23. A polarizer according to claim 1, wherein the cross-section of the polarizer is subdivided into small zones, the zones having at least one of constant deflection angle and equal inclination angle, the zones covering the entire illuminated cross-section of the polarizer.

24. A polarizer according to claim 23, wherein the zones have a shape which is at least one of polygonal and hexagonal.

25. A microlithographic projection system comprising:

an illumination device including a light source for illuminating a mask;

a projection lens following said illumination device for forming an image of a pattern appearing on said mask on to an image plane of said projection lens; and at least one polarizer for transforming a light beam incident along an optical axis into an exiting light beam having a prescribed distribution of locally varying polarization states over its cross-Section;

wherein the polarizer comprises at least one birefringent element having a crystal axis and a finite axial thickness for generating a phase shift between mutually orthogonally polarized field components of transmitted light;

wherein the illuminated cross-section of said polarizer is subdivided into numerous zones;

wherein at least one of said zones is configured such that its transmission direction for light is inclined with respect to said crystal axis of said zone within said zone at an inclination angle greater than 0° and less than 90° and lies in a transmission plane defined by said transmission direction and said crystal axis; and wherein the axial thickness of said zone and the inclination angle are adapted such that a difference in the optical path lengths of said field components within said zone corresponds to a prescribed relative retardation upon exiting said polarizer and the orientation of the transmission plane of every such zone is prealigned such that the desired, local, preferred polarization directions exist within that zone, whereby the prescribed distribution of locally varying polarization states is obtained exclusively by rotating the polarization state of the incident light beam, rather than by filtering.

26. A microlithographic projection system according to claim 25, wherein said polarizer is incorporated into said illumination device between said light source and said mask.

27. A microlithographic projection system according to claim 26, wherein said polarizer is incorporated into said illumination device in the vicinity of a plane conjugate to a system aperture of said projection lens.

28. A microlithographic projection system according to claim 25 comprising a light path and a final polarizing optical element arranged along said light path, wherein said polarizer is arranged following said final polarizing optical element.

29. A microlithographic projection system according to claim 28, wherein said final polarizing optical element is a deflection mirror.

30. A method for fabricating micro-devices, comprising the following steps:

providing a mask having a prescribed pattern;

illuminating said mask with ultraviolet light having a prescribed wavelength using an illumination device including at least one polarizer;

projecting an image of said pattern onto a photosensitive substrate arranged in the vicinity of the image plane of a projection lens;

wherein the polarizer transforms a light beam incident along an optical axis into an exiting light beam having a prescribed distribution of locally varying polarization states over its cross-section;

wherein the polarizer comprises at least one birefringent element having a crystal axis and a finite axial thickness for generating a phase shift between mutually orthogonally polarized field components of transmitted light;

wherein the illuminated cross-section of said polarizer is subdivided into numerous zones;

wherein at least one of said zones is configured such that its transmission direction for light is inclined with respect to said crystal axis of said zone within said zone at an inclination angle greater than 0° and less than 90° and lies in a transmission plane defined by said transmission direction and said crystal axis; and wherein the axial thickness of said zone and the inclination angle are adapted such that a difference in the optical path lengths of said field components within said zone corresponds to a prescribed relative retardation upon exiting said polarizer and the orientation of the transmission plane of every such zone is prealigned such that the desired, local, preferred polarization directions exist within that zone, whereby the prescribed distribution of locally varying polarization states is obtained exclusively by rotating the polarization state of the incident light beam, rather than by filtering.

31. A method according to claim 30, utilized for fabricating semiconductor devices.

32. A polarizer for transforming a light beam incident along an optical axis into an exiting light beam that has a prescribed distribution of locally varying polarization states over its cross-section, the polarizer comprising:

a birefringent element having a crystal axis and a finite axial thickness for generating a phase shift between mutually orthogonally polarized field components of transmitted light;

the illuminated cross-section of said polarizer is subdivided into numerous zones;

at least one of said zones is configured such that its transmission direction for light is inclined with respect to said crystal axis of said zone within said zone at an inclination angle greater than 0° and less than 90° and lies in a transmission plane defined by said transmission direction and said crystal axis;

wherein the axial thickness of said zone and the inclination angle are adapted such that a difference in the optical path lengths of said field components within said zone corresponds to a prescribed relative retardation upon exiting said polarizer and the orientation of the transmission plane of every such zone is prealigned such that the desired, local, preferred polarization directions exist within that zone, and wherein said birefringent element is a single-layer structure, whereby the prescribed distribution of locally varying polarization states is obtained by rotating the polarization state of the incident light beam.

33. A polarizer according to claim 32, wherein said birefringement element is a single element extending over the entire cross-section of the polarizer.

34. A polarizer according to claim 32, wherein said birefringent element is a plate fabricated from a birefringent material.

35. A polarizer according to claim 32, wherein said birefringement element is fabricated from one of magnesium fluoride and crystalline quartz.

36. A polarizer according to claim 32, wherein said polarizer has an axial thickness in excess of 100 µm.

37. A polarizer according to claim 32, wherein said polarizer has an axial thickness between approximately 200 µm and approximately 600 µm.

38. A polarizer for transforming a light beam incident along an optical axis into an exiting light beam that has a prescribed distribution of locally varying polarization states over its cross-section, the polarizer comprising:

a birefringent element having a crystal axis and a finite axial thickness for generating a phase shift between mutually orthogonally polarized field components of transmitted light;

the illuminated cross-section of said polarizer is subdivided into numerous zones; at least one of said zones is configured such that its transmission direction for light is inclined with respect to said crystal axis of said zone within said zone at an inclination angle greater than 0° and less than 90° and lies in a transmission plane defined by said transmission direction and said crystal axis;

wherein the axial thickness of said zone and the inclination angle are adapted such that a difference in the optical path lengths of said field components within said zone corresponds to a prescribed relative retardation upon exiting said polarizer and the orientation of the transmission plane of every such zone is prealigned such that the desired, local, preferred polarization directions exist within that zone, wherein said birefringement element has the crystal axis aligned roughly parallel to an optical axis of the polarizer; and wherein at least one deflecting structure is assigned to said birefringement element, said deflecting structure being designed to yield the prescribed inclination angle and inclination direction for that zones, whereby the prescribed distribution of locally varying polarization states is obtained by rotating the polarization state of the incident light beam.

39. A polarizer according to claim 38, wherein a separate deflecting structure is assigned to each of said zones.

40. A polarizer according to claim 38, wherein said birefringement element is a single element extending over the entire cross-section of the polarizer.

41. A polarizer according to claim 38, wherein deflecting structures for deflecting incident light along said inclined transmission direction are provided on an entrance face of said birefringent element and deflecting structures for reversing said deflection are provided on an exit face of said birefringent element.

42. A polarizer according to claim 38, wherein said birefringent element is a plate fabricated from a birefringent material, wherein deflecting structures are formed directly on at least one of an entrance face and an exit face of said plate.

43. A polarizer according to claim 38, wherein that birefringement element is fabricated from one of magnesium fluoride and crystalline quartz.

44. A polarizer according to claim 38, wherein at least one of said deflecting structures is a diffractive structure.

45. A polarizer according to claim 38, wherein at least one of said deflecting structures is a refractive structure.

46. A polarizer according to claims 38, wherein at least one of said deflecting structures is a diffractive and refractive structure.

47. A polarizer according to claim 38, wherein at least one of said deflecting structures deflects light in the manner of a hologram.

48. A polarizer according to claim 38, wherein said polarizer is designed to transform incident circularly polarized light into exiting, locally linearly polarized light.

49. A polarizer according to claim 48, wherein the exiting polarizered light is one of tangentially and radially polarized.

50. A polarizer according to claim 48, wherein said prescribed relative retardation is roughly one-fourth the wavelength of said incident light.

51. A polarizer according to claim 38, wherein said polarizer is designed to transform incident light that is linearly polarized in a single direction over its entire cross-section into exiting, locally linearly polarized light.

52. A polarizer according to claim 51, wherein the exiting polarizered light is one of tangentially and radially polarized.

53. A polarizer according to claim 47, wherein said prescribed relative retardation is roughly one-half the wavelength of said incident light.

54. A polarizer according to claim 38, wherein said polarizer has an axial thickness in excess of 100 µm.

55. A polarizer according to claim 38, wherein said polarizer has an axial thickness between approximately 200 µm and approximately 600 µm.

56. A polarizer according to claim 38, wherein the cross-section of the polarizer is subdivided into small zones, the zones having at least one of constant deflection angle and equal inclination angle, the zones covering the entire illuminated cross-section of the polarizer.

57. A polarizer according to claim 56, wherein the zones have a shape which is at least one of polygonal and hexagonal.

58. A polarizer for transforming a light beam incident along an optical axis into an exiting light beam that has a prescribed distribution of locally varying polarization states over its cross-section, the polarizer comprising:

a birefringent element having a crystal axis and a finite axial thickness for generating a phase shift between mutually orthogonally polarized field components of transmitted light;

the illuminated cross-section of said polarizer is subdivided into numerous zones;

at least one of said zones is configured such that its transmission direction for light is inclined with respect to said crystal axis of said zone within said zone at an inclination angle greater than 0° and less than 90° and lies in a transmission plane defined by said transmission direction and said crystal axis;

wherein the axial thickness of said zone and the inclination angle are adapted such that a difference in the optical path lengths of said field components within said zone corresponds to a prescribed relative retardation upon exiting said polarizer and the orientation of the transmission plane of every such zone is prealigned such that the desired, local, preferred polarization directions exist within that zone, and wherein said polarizer is designed to transform incident circularly polarized light into exiting, locally linearly polarized light, whereby the prescribed distribution of locally varying polarization states is obtained by rotating the polarization state of the incident light beam.

59. A polarizer according to claim 58, wherein the exiting polarizered light is one of tangentially and radially polarized.

60. A polarizer according to claim 58, wherein said prescribed relative retardation is roughly one-fourth the wavelength of said incident light.

61. A polarizer for transforming a light beam incident along an optical axis into an exiting light beam that has a prescribed distribution of locally varying polarization states over its cross-section, the polarizer comprising:

a birefringent element having a crystal axis and a finite axial thickness for generating a phase shift between mutually orthogonally polarized field components of transmitted light;

the illuminated cross-section of said polarizer is subdivided into numerous zones;

at least one of said zones is configured such that its transmission direction for light is inclined with respect to said crystal axis of said zone within said zone at an inclination angle greater than 0° and less than 90° and lies in a transmission plane defined by said transmission direction and said crystal axis;

wherein the axial thickness of said zone and the inclination angle are adapted such that a difference in the optical path lengths of said field components within said zone corresponds to a prescribed relative retardation upon exiting said polarizer and the orientation of the transmission plane of every such zone is prealigned such that the desired, local, preferred polarization directions exist within that zone, and wherein said polarizer is designed to transform incident light that is linearly polarized in a single direction over its entire cross-section into exiting, locally linearly polarized lights, whereby the prescribed distribution of locally varying polarization states is obtained by rotating the polarization state of the incident light beam.

62. A polarizer according to claim 61, wherein the exiting polarizered light is one of tangentially and radially polarized.

63. A polarizer according to claim 61, wherein said prescribed relative retardation is roughly one-half the wavelength of said incident light.

* * * * *